United States Patent
Homer et al.

(10) Patent No.: US 6,626,687 B2
(45) Date of Patent: Sep. 30, 2003

(54) LOW PROFILE NIC JUMPER SOLUTION USING ZIF CONNECTOR

(75) Inventors: Steven S. Homer, Tomball, TX (US); Lee Atkinson, Houston, TX (US); Rahul V. Lakdawala, Cypress, TX (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/105,207

(22) Filed: Mar. 25, 2002

(65) Prior Publication Data

US 2003/0027436 A1 Feb. 6, 2003

Related U.S. Application Data

(62) Division of application No. 09/920,233, filed on Aug. 1, 2001.

(51) Int. Cl.[7] .............................................. H01R 13/66
(52) U.S. Cl. ........................ 439/151; 361/803; 710/313
(58) Field of Search ............................ 439/64, 218, 151, 439/507; 361/803, 784, 785, 749; 710/308, 301, 313, 316

(56) References Cited

U.S. PATENT DOCUMENTS

| | | | |
|---|---|---|---|
| 3,354,355 A | 11/1967 | Cliffgard et al. | 317/101 |
| 3,475,717 A | 10/1969 | Lane | 439/260 |
| 3,876,884 A | 4/1975 | Housman et al. | 307/10.5 |
| 4,647,123 A | 3/1987 | Chin et al. | 439/61 |
| 4,885,482 A | 12/1989 | Sharp et al. | 326/47 |
| 5,130,893 A | 7/1992 | Straate et al. | 361/728 |
| 5,329,427 A * | 7/1994 | Hogdahl | 361/730 |
| 5,461,546 A * | 10/1995 | Kobayashi et al. | 361/796 |
| 5,596,762 A * | 1/1997 | Rudi | 710/301 |
| 5,628,031 A * | 5/1997 | Kikinis et al. | 710/73 |
| 6,099,346 A | 8/2000 | Hashiguchi et al. | 439/495 |
| 6,122,695 A * | 9/2000 | Cronin | 710/100 |
| 6,175,504 B1 * | 1/2001 | Hood et al. | 361/749 |
| 6,295,565 B1 * | 9/2001 | Lee | 710/301 |

* cited by examiner

Primary Examiner—Tulsidas Patel

(57) ABSTRACT

A connection technique for switchably and mutually exclusively coupling a plurality of device sets. The connection technique utilizes a low profile connector having multiple circuit sets, each of which is configured for mutually exclusive and removable insertion into a receptacle coupled to multiple devices. Each one of the multiple circuit sets, which is inserted into the receptacle, couples a desired set of the plurality of device sets.

29 Claims, 3 Drawing Sheets

LOW PROFILE NIC JUMPER SOLUTION USING ZIF CONNECTOR

The following is a divisional of application Ser. No. 09/920,233, filed on Aug. 1, 2001.

FIELD OF THE INVENTION

The present technique relates generally to electrical connection systems and, more particularly, to electrical connection systems for computing devices. The present technique provides a system and method for switching connections between a plurality of device sets by utilizing a multi-directional connector and a switchable multi-circuit board.

BACKGROUND OF THE INVENTION

This section is intended to introduce the reader to various aspects of art, which may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

A variety of electrical connection systems are currently used in computer systems and various other electronic and computing devices. Electrical connections are typically formed with male and female electrical connectors, such as a male plug disposed on an electrical cable and a female receptacle disposed on a component (e.g., a port on a computer system). For example, a computer system may have a network port, a power port, an audio port, a video port, a parallel port, a serial port, a USB port, a midi/game port, a wireless communication port (e.g., an IRDA port, an optical port, a radio frequency port, a blue tooth technology port, etc.) and various other ports for communicating with external devices. In the typical connector configuration, the male and female connectors are communicatively coupled in a single specific connection. Moreover, a port or connector is typically configured to communicate with a single device (e.g., an Input/Output device), such as with communication between a computer system and a peripheral device. This conventional connection system does not allow switching between a plurality of devices, such as a modem and a network card, without unplugging one device and plugging in the other device.

On circuit boards, such as computer motherboards, electrical connections may be formed by male/female connector assemblies and jumpers. For example, the circuit board may include a male connector assembly having a plurality of electrical posts protruding from the circuit board. A female connector assembly may then be inserted over the electrical posts to couple the circuit board to a desired device. In computer systems, jumpers are often used to couple pairs of protruding posts to obtain a desired electrical configuration for the computer system. For example, several pairs of jumpers may be used to couple adjacent male pins on the circuit board to configure the computer system for the desired computing components. Unfortunately, this jumper technique consumes considerable space and is generally only useful for coupling adjacent electrical posts.

In compact electronic devices, such as portable computer systems, the various components and electronics must be configured to consume a minimal amount of space to enable a thinner and more compact design for the overall computing device. The relatively thin profile of circuit boards allows designers to reduce space consumption of the computing structure, yet the various components disposed in the computing structure still consume a considerable amount of space. Accordingly, various computing components are integrated in the computing device (e.g., onto the motherboard) to reduce the overall size of the computing structure. For example, network circuitry and other communication circuitry may be integrated with the circuit board and the processor to reduce the overall size of the computing structure. Various other components, such as sound and video circuitry, also may be integrated with the circuit board and processor. However, it is still desirable to provide electrical ports and circuitry to communicate with other internal and external computing components, such as a mini-PCI network card.

Accordingly, a versatile electrical connection technique is needed to provide a switchable set of electrical connections between various internal and peripheral devices. There is also a need for a relatively low profile electrical connection system to reduce space consumption of the circuitry and the connection system.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

The present technique provides a system and method for switchably and mutually exclusively coupling a plurality of devices sets. The connection technique utilizes a low profile connector having multiple circuit sets, which are configured for mutually exclusive and removable insertion into a receptacle coupled to multiple devices. Each one of the multiple circuit sets, which is inserted into the receptacle, switchably couples a desired set of the plurality of device sets.

An aspect of the present technique provides an electrical connector for switchably coupling multiple devices. The electrical connector includes a switchable connector having a plurality of conductor sets configured for switchable coupling with a communication receptacle for a plurality of devices, wherein each set of the plurality of conductor sets provides a connection between a desired device set of the plurality of devices.

Another aspect of the present technique provides a system for switchably coupling desired sets of electronics. The system includes a receptacle communicatively coupled to a plurality of electronics and a multi-circuit connector panel. The multi-circuit connector panel has a first circuit insertable into the receptacle to communicatively couple a first set of the plurality of electronics. The multi-circuit connector panel also has a second circuit switchable with the first circuit and insertable into the receptacle to communicatively couple a second set of the plurality of electronics.

Another aspect of the present technique provides a computing device having circuitry for switchably communicating with multiple components. The computing device includes a computing device and a device connection assembly disposed in the computing device. The device connection assembly includes a receptacle communicatively coupled to a plurality of components for the computing device. The device connection assembly also has a connector panel comprising multiple conductor sets changeably coupleable with the receptacle to communicatively couple a desired set of the plurality of components.

Another aspect of the present technique provides a method for changeably connecting electronic devices. The method includes the act of communicatively coupling a plurality of electronic devices to a connector assembly. The method also includes changeably coupling a desired circuit of a multi-circuit panel to the connector assembly communicatively coupled to a desired device set of the plurality of electronic devices.

Another aspect of the present technique provides a method of forming a low profile switchable device connector. The method includes the act of forming a plurality of circuits sets on a panel, each circuit set having a plurality of conductors with opposite ends terminating on a desired edge portion of the panel. The method also includes positioning the plurality of circuit sets on multiple side portions of the panel for removable coupling with a multi-device connector assembly for switchably and mutually exclusively coupling a plurality of desired device sets from a plurality of devices communicatively coupled to the multi-device connector assembly.

BRIEF DESCRIPTION OF THE DRAWINGS

Exemplary embodiments will hereafter be described with reference to the accompanying drawings, wherein like reference numerals denote like elements, and.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
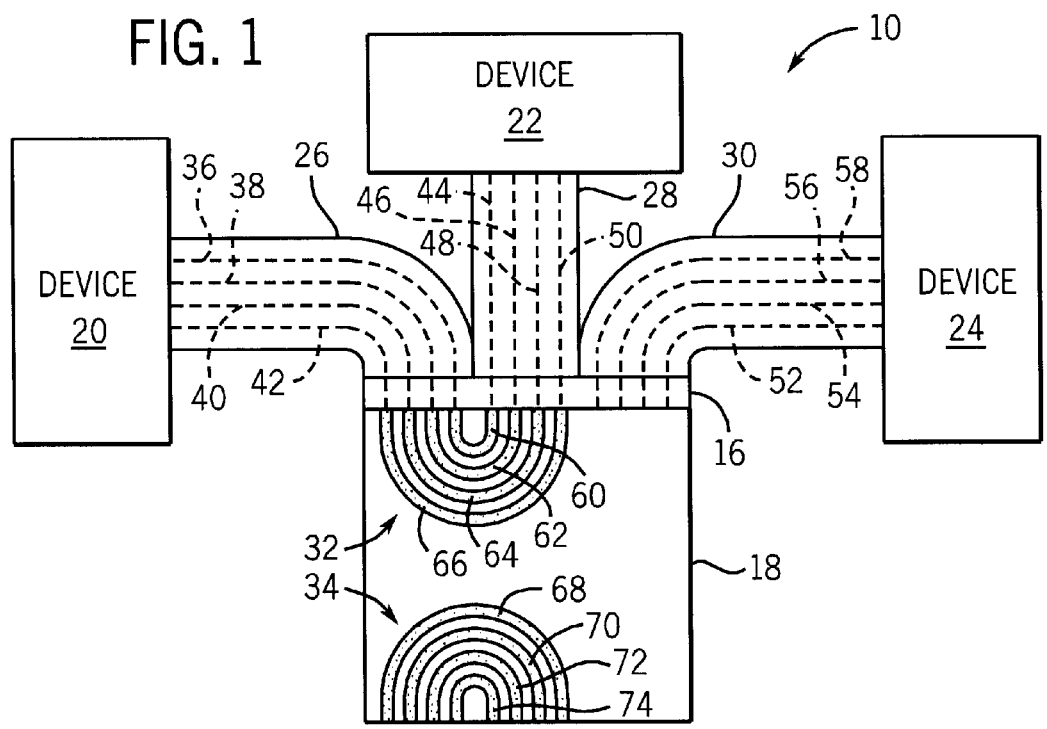
FIG. 1 is a top view of an exemplary electrical connection system having a multi-directional connector and a switchable multi-circuit board that is insertable into the multi-directional connector.
Figure 2:
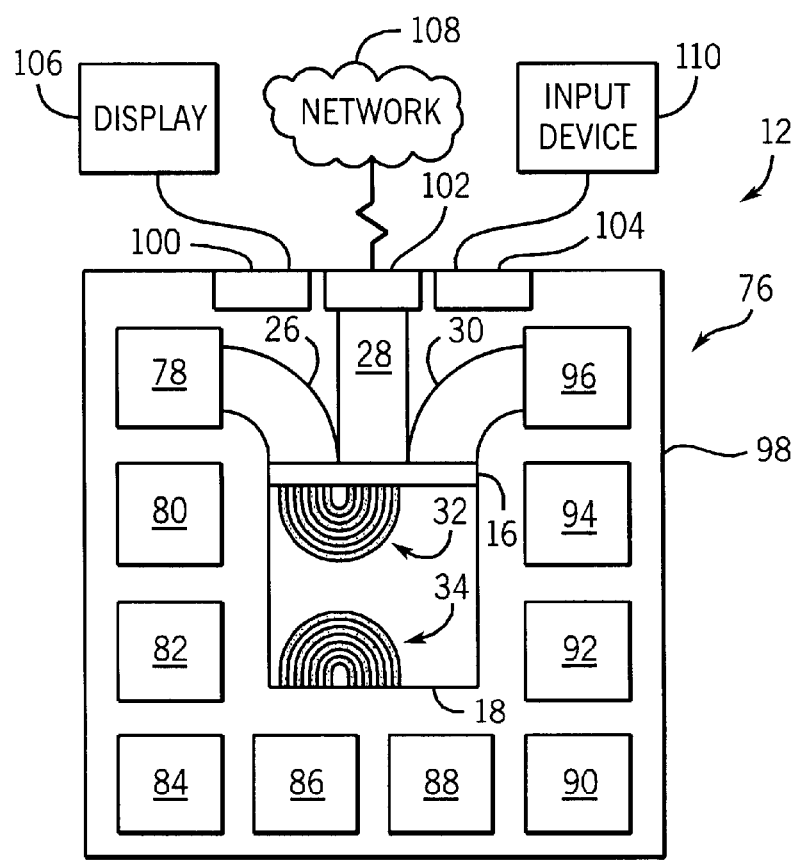
FIG. 2 is a diagram of an exemplary computing system utilizing the multi-directional connector and the switchable multi-circuit board to facilitate electrical switching between two components and a port for external devices.
Figure 3:
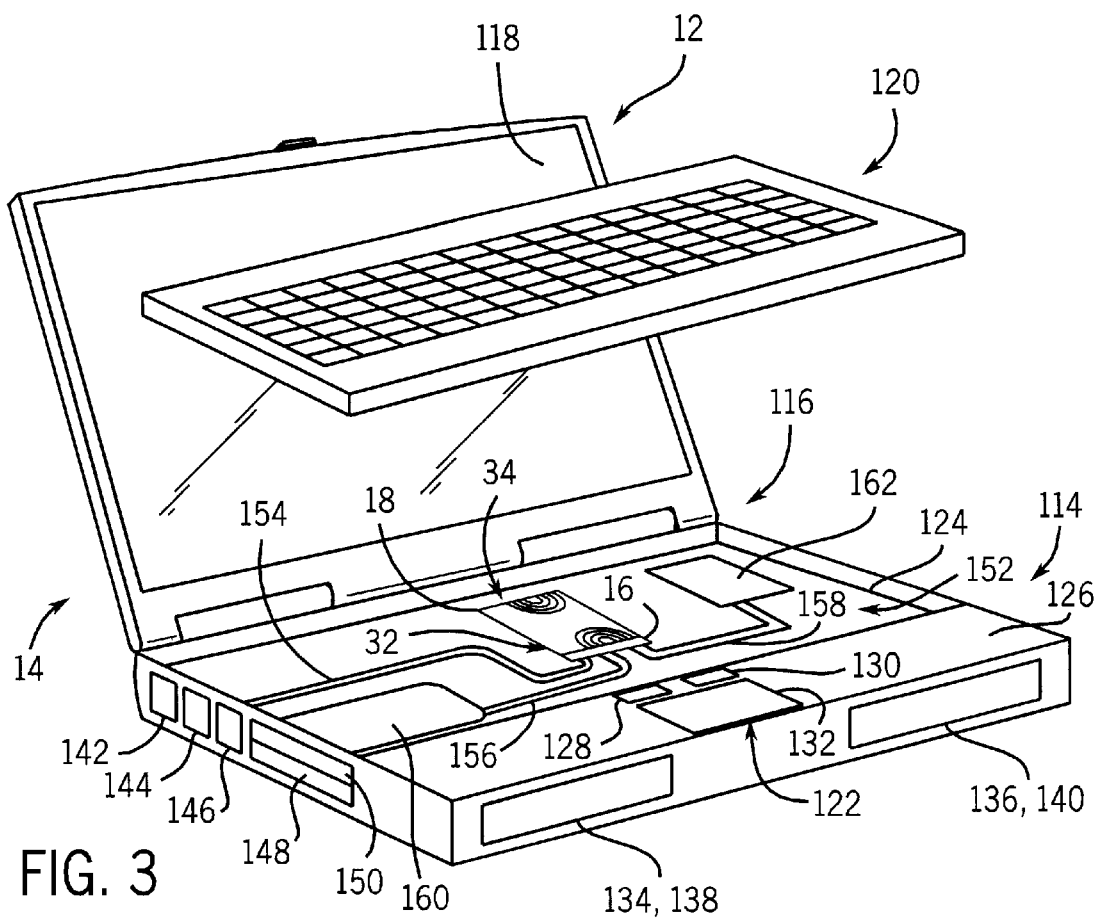
FIG. 3 is a perspective view of an exemplary computing device having the multi-directional connector and the switchable multi-circuit board disposed in a recess below a removable keyboard.

The present technique is directed toward a system and method for versatile and compact electrical connections for electrical devices, ports and various other computing components. The present technique may be utilized in a variety of electrical systems, electronics, computer systems and components to facilitate manual switching between a plurality of devices, ports or components. As illustrated in FIGS. 1–3, the electrical connection system of the present technique may be utilized in a relatively confined space. Certain aspects of the present technique have been incorporated into an electrical connection system 10, a computing system 12 and a compact computing device 14, respectively. As illustrated in FIG. 1, the electrical connection system 10 includes a plurality of devices connected by cables, a multi-directional connector 16 and a switchable multi-circuit board 18.

The multi-directional connector 16 is communicatively coupled to devices 20, 22, and 24 via cables 26, 28, and 30, respectively. The devices 20, 22, and 24 may comprise a computing component, a port, or a variety of other electronics or devices. The cables 26, 28, and 30 may include a standard parallel cable, a serial cable, a communication cable, a flexible printed circuit, or a variety of other electrical connection assemblies having one or more electrical paths between the devices 20, 22, and 24 and the multi-directional connector 16. Moreover, the cables 26, 28 and 30 may have opposite communication paths (e.g., input or output) between the devices 20, 22, and 24 and the multi-directional connector 16. For example, the devices 20 and 24 may comprise two sorts of computing devices, such as a network device and a memory device, while the device 22 may embody a port for external communication with other devices. Thus, the multi-directional connector 16 may have cables coming from various input and output devices and ports.

The switchable multi-circuit board 18 is removably insertable into a receptacle of the multi-directional connector 16 to facilitate a plurality of electrical connections between the devices 20, 22, and 24 and the corresponding cables 26, 28, and 30. For example, as illustrated in FIG. 1, the switchable multi-circuit board 18 has circuit sets 32 and 34 disposed on opposite sides of the switchable multi-circuit board 18. The switchable multi-circuit board 18 and the circuit set 32 may be removed from the receptacle of the multi-directional connector 16 and rotated for insertion of the circuit set 34 into the receptacle of the multi-directional connector 16. Accordingly, the electrical connections between the devices 20, 22 and 24 and the cables 26, 28, and 30 may be changed by removing, rotating, and re-inserting the switchable multi-circuit board 18 and the corresponding circuit set (e.g., circuit sets 32 and 34) into the receptacle of the multi-directional connector 16.

Depending on the desired application, the multi-directional connector 16 may have a variety of electrical connection assemblies disposed within the receptacle. The thickness of the multi-directional connector 16 also may be altered for the particular application. Moreover, the switchable multi-circuit board 18 may have a variety of profiles and thicknesses depending on the particular application. For example, the multi-directional connector 16 may embody a zero insertion force ("ZIF") connector, while the switchable circuit board 18 may embody a flexible printed circuit ("FPC"). The ZIF connector and the flexible printed circuit consume a minimal amount of space for this versatile electrical connection system. However, a variety of other rigid, flexible, compact and other desirable configurations may be used within the scope of the present technique.

As illustrated in FIG. 1, a plurality of conductors are disposed within the cables 26–30 and on the switchable circuit board 18. For example, the cables 26, 28 and 30 have conductors 36–42, 44–50 and 52–58, respectively. The circuit sets 32 and 34 also have a plurality of conductors disposed on surfaces of the switchable multi-circuit board 18. For example, the circuit set 32 has conductors 60, 62, 64 and 66, while the circuit set 34 has conductors 68, 70, 72 and 74. Accordingly, as illustrated in FIG. 1, the circuit set 32 is disposed in the multi-directional connector 16 to provide an electrical connection between conductors 36–42 of cable 26 and conductors 44–50 of cable 28 via the conductors 60–66 of the circuit set 32. If an electrical connection is desired between the devices 22 and 24, the switchable multi-circuit board 18 may be removed, rotated, and re-inserted with the circuit set 34 being disposed in the multi-directional connector 16. In this electrical configuration, the conductors 68–74 of the circuit set 34 provide an electrical connection between the conductors 44–50 of the cable 28 and conductors 52–58 of the cable 30. The present technique thereby allows a plurality of electrical connections between the devices 20, 22, and 24 and the corresponding cables 26, 28, and 30 via the multiple circuit sets 32 and 34.

As noted above, the multi-directional connector 16 and the switchable multi-circuit board 18 may be utilized in a variety of electronics, such as the computing system 12 illustrated in FIG. 2. As illustrated, the multi-directional connector 16 and the switchable multi-circuit board 18 are disposed in a computing device 76 having a plurality of computing components, such as computing components 78, 80, 82, 84, 86, 88, 90, 92, 94, and 96, which are disposed in the housing 98. The computing device 76 also may have a plurality of ports for external devices. For example, ports 100, 102, and 104 are provided on the computing device 76 for external communication and data exchange with devices, such as a display 106, a network 108, and an input device 110. The computing components 78–96 may include a variety of circuitry and processing components, such as a processor, RAM memory, a hard drive, a disk drive, a CD ROM drive, a DVD ROM drive, a tape drive, a communication device (e.g., a modem, a network card, a wireless communication device, blue tooth technology, etc.), a sound card, a video card, and various other computing circuitry. Also, the ports 100, 102, and 104 may comprise a variety of technologies, such as a parallel port, a serial port, a USB port, a PS/2 port, a wireless communication port, an audio or video port, a power port, and various other communication and data exchange ports. Accordingly, as discussed above with reference to FIG. 1, the multi-directional connector 16 and the switchable multi-circuit board 18 may be utilized in the computing device 76 to provide a plurality of switchable connections between the computing components 78–96, the ports 100–104 and the corresponding external devices and networks.

As illustrated, the multi-directional connector 16 is electrically coupled to computing components 78 and 96 and to the port 102 for the network 108. The switchable multi-circuit board 18 has the circuit set 32 disposed in the multi-directional connector 16 such that the computing component 78 is communicatively coupled to the port 102 and corresponding network 108. However, as discussed above, the switchable multi-circuit board 18 may be removed from the multi-directional connector 16, rotated, and re-inserted into the multi-directional connector 16 with the circuit set 34 electrically coupling the computing component 96 to the port 102 and corresponding network 108. For example, the computing component 78 may be an integrated network card on a motherboard of the computing device 76, while the computing component 96 may be a removable network card (e.g., a PCMCIA or mini PCI network card). Thus, the present technique facilitates versatile electrical coupling between internal and external components of the computing system 12.

The multi-directional connector 16 and the switchable multi-circuit board 18 also can be disposed in compact computing devices and portable electronics, such as the compact computing device 14 illustrated in FIG. 3. As illustrated, the compact computing device 14 has a panel display 112 rotatably coupled to a housing 114 via a hinge assembly 116 disposed between the panel display 112 and the housing 114. The panel display 112 has a display screen 118, which may be a liquid crystal display or any other suitable low profile display. The housing 114 has a plurality of computing components and user interaction devices, such as a keyboard 120 and a coordination device 122. As illustrated, the keyboard 120 may be removable from a recess 124 disposed in a top surface 126 of the housing 114. The coordination device 122 may include a variety of buttons and user input devices, such as buttons 128 and 130 and a touch pad 132. It should also be noted that the keyboard 120 may incorporate the coordination device 122 and also may have a wireless communication assembly for wireless communication with the compact computing device 14. The housing 114 also may include various computing components and ports, similar to those illustrated in the computing system 12 of FIG. 2.

For example, the housing 114 may have bays 134 and 136 for fixedly or removably accepting computing devices 138 and 140, respectively. The housing 114 also may have ports, such as ports 142, 144 and 146, for communication and data exchange with a variety of external devices and networks. As illustrated, the compact computing device 114 also may have one or more compact bays, such as PCMCIA slots, for housing a relatively low profile external device. For example, slots 148 and 150 are disposed in a side of the housing 114 adjacent the ports 142–146.

With the keyboard 120 removed from the housing 114, as illustrated in FIG. 3, a variety of circuitry is exposed to a user in the recess 124. For example, exposed circuitry 152 is accessible in the recess 124 to facilitate user interaction and configuration of internal components of the compact computing device 14. As illustrated, the exposed circuitry 152 includes the multi-directional connector 16, the switchable multi-circuit board 18, electrical cables 154, 156, and 158 and computing components 160 and 162. As discussed above with reference to FIGS. 1 and 2, the switchable multi-circuit board 18 may be removed from the multi-directional connector 16, rotated, and then reinserted into the multi-directional connector 16 to switch the desired circuit set of the circuit sets 32 and 34 and to connect the desired sets of electrical cables 154, 156, and 158. As illustrated, the circuit set 32 is coupled to the multi-directional connector 16 such that the multi-directional connector 16 electrically couples the computing component 162 to the port 146 via the electrical cables 154 and 158. If the switchable multi-circuit board 18 is removed, rotated and reinserted into the multi-directional connector 16, the circuit set 34 provides an electrical coupling between the computing component 160 and the port 146 via the electrical cables 154 and 156.

In the illustrated embodiment of FIG. 3, the computing component 162 is an integral component of the compact computing device 114. For example, the computing component may be an integral communication device or network card. In contrast, the computing component 160 is a removable computing component, such as a mini PCI network card or other PCMCIA card. Accordingly, the computing component 160 may be removably inserted into one of the slots 148 and 150 for utilization and interaction with the compact computing device 14 after performing the appropriate switch with the multi-directional connector 16 and the switchable multi-circuit board 18. It should also be noted that the electrical cables 154, 156, and 158 and the switchable multi-circuit board 18 may embody flexible printed circuits or other low profile circuitry to reduce space consumption in the compact computing device 14. As noted above, the multi-directional connector 16 may be a relatively low profile connector, such as a zero insertion force (ZIF) connector, adapted for the low profile or flexible circuitry of the switchable multi-circuit board 18 and the electrical cables 154–158. Accordingly, the present technique facilitates maximum flexibility and integration of the various computing components of the electrical connection system 10, the computing system 12, and the compact computing device 14 by using a low profile switchable connection system having multiple circuit sets.

Figure 4:
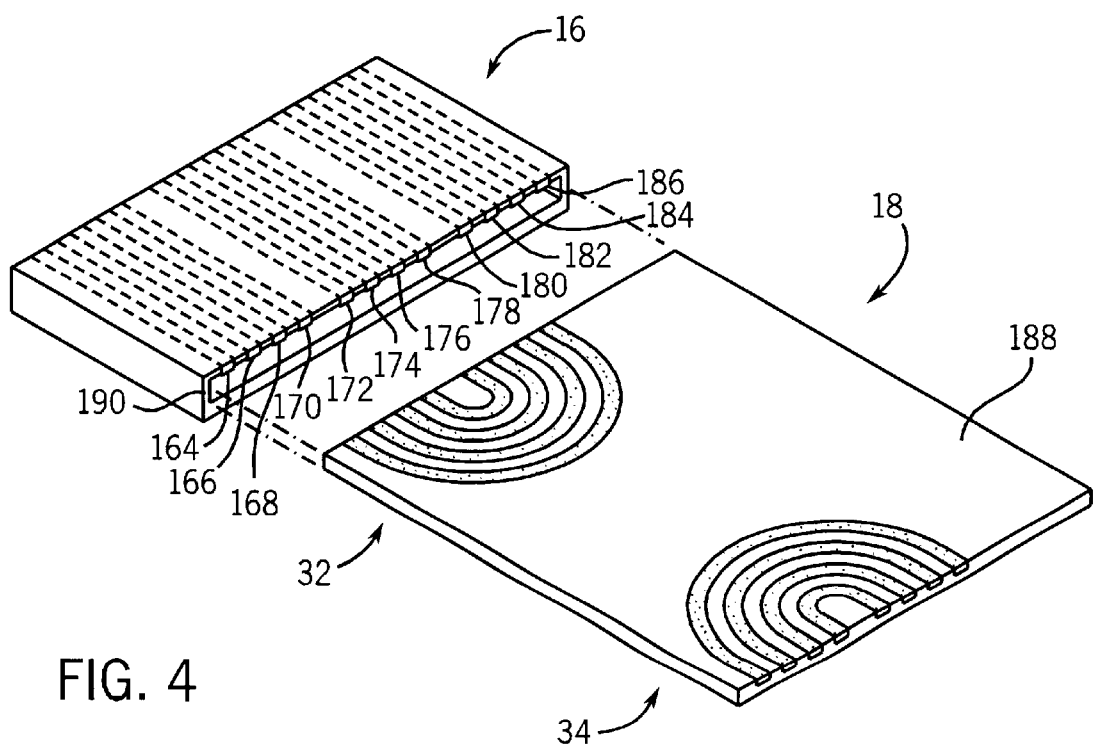
FIG. 4 is a perspective view of the multi-directional connector and the switchable multi-circuit board having a plurality of circuit sets, with one circuit set aligned with a portion of electrical connectors in the multi-directional connector.

A perspective view of the multi-directional connector 16 and the switchable multi-circuit board 18 is illustrated in FIG. 4. As illustrated, the multi-directional connector 16 has a plurality of electrical connectors, such as electrical connectors 164–186, extending through a top portion of the multi-directional connector 16. The switchable multi-circuit board 18 has the circuit sets 32 and 34 disposed on a top surface 188. The switchable multi-circuit board 18 is insertable into a receptacle 190 of the multi-directional connector 16 adjacent the electrical connectors 164–186, such that the circuit sets 32 or 34 provide electrical contact between the desired electrical connectors 164–186.

It should also be noted that the multi-directional connector 16 may have any suitable connection mechanism for the electrical connectors 164–186 and the receptacle 190. For example, the electrical connectors 164–186 may be disposed in a bottom portion having the receptacle 190 above the electrical connectors 164–186. The electrical connectors 164–186 and the receptacle 190 also may be configured to receive pins extending from the corresponding circuit sets 32 and 34 of the switchable multi-circuit board 18. Thus, any suitable male and female connection mechanism may be utilized for the multi-directional connector 16 and the switchable multi-circuit board 18 within the scope of the present technique. The multi-directional connector 16 also may be coupled to any number of electronics, computing components, ports, or desired devices for the particular application. For example, the multi-directional connector 16 may be coupled to two or more computing devices, two or more ports, and any other desired devices. The switchable multi-circuit board 18 also may have a number of circuit sets in addition to the circuit sets 32 and 34 illustrated on the switchable multi-circuit board 18 in FIGS. 1–4.

Figure 5:
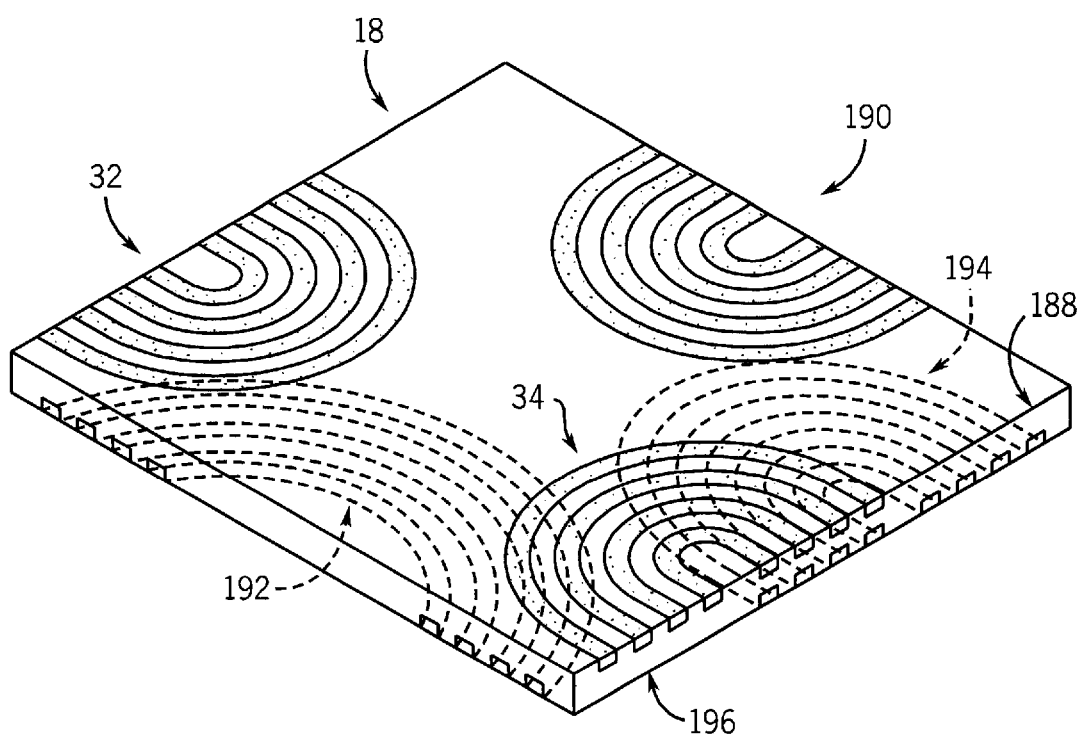
FIG. 5 is an alternate embodiment of the switchable multi-circuit board having a plurality of circuit sets disposed on opposite sides of a circuit board.

An alternate embodiment of the switchable multi-circuit board 18 is illustrated in FIG. 5. As illustrated, the switchable multi-circuit board 18 has circuit sets 32 and 34 disposed on the surface 188. The board 18 also has a circuit set 190 disposed on the surface 188 and circuit sets 192 and 194 disposed on an opposite surface 196 from the surface 188. Accordingly, the switchable multi-circuit board 18 may provide a variety of circuit connections on various portions of both sides 188 and 190 to facilitate versatile switching between a plurality of components, circuitry, and ports. It should also be noted that the switchable multi-circuit board 18 may have any suitable geometry for the desired application and to accommodate the desired number of circuit sets on the surfaces 188 and 190. As discussed above, the switchable multi-circuit board 18 may be a standard circuit board or it may be a flexible circuit, such as a flexible printed circuit. Thus, the present technique facilitates multiple switchable connections in a relatively low profile connector assembly, which may be used in compact electronics and computing devices.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A portable computing device, comprising
a component housing;
first, second, and third components disposed in the component housing;
a receptacle having first, second, and third communication connector sections coupled to the first, second, and third components, respectively; and
a component connector panel switchably insertable into the receptacle, wherein the component connector panel comprises a different conductor set for each of a plurality of insertion orientations, each different conductor set extending between a different set of communication connector sections.

2. The portable computing device of claim 1, wherein the component housing comprises a flat-panel display.

3. The portable computing device of claim 1, wherein the component housing comprises a keyboard.

4. The portable computing device of claim 1, wherein the receptacle and the component connector panel are disposed under a removable panel.

5. The portable computing device of claim 4, wherein the removable panel comprises an input device.

6. The portable computing device of claim 5, wherein the first, second, and third components comprise two mutually exclusive devices.

7. The portable computing device of claim 6, wherein the two mutually exclusive devices comprise different network devices.

8. The portable computing device of claim 6, wherein the two mutually exclusive devices comprise a removable device and an integral device.

9. The portable computing device of claim 6, wherein at least one of the first, second, and third components comprises an input/output port.

10. The portable computing device of claim 1, wherein the receptacle and the component connector panel have a low profile structure adapted for the portable computing device.

11. The portable computing device of claim 6, wherein the first, second, and third communication connector sections are separately coupled to the first, second, and third components, respectively.

12. The portable computing device of claim 1, wherein the component connector panel comprises a low-profile flexible module.

13. The portable computing device of claim 1, wherein the different conductor sets are disposed on different surface portions of the component connector panel.

14. The portable computing device of claim 1, wherein the different surface portions comprise opposite sides of the component connector panel.

15. The portable computing device of claim 1, wherein the different surface portions comprise opposite edge sections of the component connector panel.

16. The portable computing device of claim 1, wherein the first, second, and third components are uncommunicative without the component connector panel.

17. A compact electronic device, comprising
a housing comprising at least three electronic components; and
a component pair switching assembly comprising:
a receptacle having a different connector section coupled to each of the at least three electronic components; and
a connector panel insertable into the receptacle and comprising a plurality of different conductor sets extending to mutually exclusive insertable portions of the connector panel, wherein each of the plurality of different conductor sets couples a different pair of the different connector sections.

18. The compact electronic device of claim 17, wherein the housing comprises a flat-panel display.

19. The compact electronic device of claim 18, wherein the housing comprises a keypad.

20. The compact electronic device of claim 17, wherein the component pair switching assembly is disposed under a removable panel.

21. The compact electronic device of claim 20, wherein the removable panel comprises an input device.

22. The compact electronic device of claim 17, wherein the component pair switching assembly has a low profile structure adapted for the compact electronic device.

23. The compact electronic device of claim 17, wherein the connector panel comprises a low-profile flexible module.

24. The compact electronic device of claim 17, wherein each of the plurality of different conductor sets extends to a different edge-side-section of the connector panel.

25. The compact electronic device of claim 17, wherein the at least three electronic components are uncommunicative without the connector panel.

26. The compact electronic device of claim 17, wherein each of the plurality of different conductor sets couples a mutually exclusive pair of the at least three electronic components.

27. The compact electronic device of claim 22, wherein each mutually exclusive pair comprises a different network device.

28. The compact electronic device of claim 22, wherein each mutually exclusive pair comprises a data communication receptacle.

29. The compact electronic device of claim 22, wherein at least one of the mutually exclusive pairs comprises a removable electronic component and at least one other of the mutually exclusive pairs comprises an integral electronic component.

* * * * *